US010031991B1

United States Patent
Chhabra et al.

(10) Patent No.: US 10,031,991 B1
(45) Date of Patent: Jul. 24, 2018

(54) SYSTEM, METHOD, AND COMPUTER PROGRAM PRODUCT FOR TESTBENCH COVERAGE

(71) Applicant: Cadence Design Systems, Inc., San Jose, CA (US)

(72) Inventors: Praveen Kumar Chhabra, Noida (IN); Hemant Gupta, Delhi (IN); Sharad Gaur, Delhi (IN); Matthew Aaron Graham, Ontario (CA); John Laurence Rose, Longmont, CO (US); Anupam Singal, New Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/221,820

(22) Filed: Jul. 28, 2016

(51) Int. Cl.
*G06F 17/50* (2006.01)

(52) U.S. Cl.
CPC ...... *G06F 17/5045* (2013.01); *G06F 17/5036* (2013.01)

(58) Field of Classification Search
CPC ............ G06F 17/5009; G06F 17/5022; G06F 17/5045; G06F 2217/86; G06F 17/5036; G01R 31/31814; G01R 31/318315; G01R 31/318342; G01R 31/318357; G01R 31/318364
USPC ........................................................ 716/106
See application file for complete search history.

(56) References Cited

U.S. PATENT DOCUMENTS

| | | | |
|---|---|---|---|
| 6,182,258 B1 * | 1/2001 | Hollander | G01R 31/31704 714/739 |
| 2002/0183956 A1 * | 12/2002 | Nightingale | G11C 29/56 702/117 |
| 2006/0190871 A1 * | 8/2006 | Likovich, Jr. | G01B 31/318314 716/104 |
| 2007/0005533 A1 * | 1/2007 | Iyer | G06F 17/504 706/19 |
| 2012/0227021 A1 * | 9/2012 | Huilgol | G06F 17/5022 716/106 |
| 2013/0318486 A1 * | 11/2013 | Sasaki | G06F 17/5045 716/106 |
| 2014/0172347 A1 * | 6/2014 | Gavish | G06F 17/5081 702/123 |
| 2014/0282315 A1 * | 9/2014 | Wakefield | G06F 17/504 716/106 |
| 2015/0310159 A1 * | 10/2015 | Raghavan, Sr. | G06F 17/5081 716/112 |

* cited by examiner

*Primary Examiner* — Paul Dinh
(74) *Attorney, Agent, or Firm* — Mark H. Whittenberger, Esq.; Holland & Knight LLP

(57) ABSTRACT

The present disclosure relates to a computer-implemented method for electronic design verification. Embodiments may include receiving an electronic design environment including both a design under test ("DUT") and a testbench. Embodiments may further include simulating an electronic design associated with the electronic design environment and generating a coverage database associated with the electronic design. Embodiments may include performing coverage analysis of the DUT and testbench using an automated inheritance aware analysis and applying the coverage analysis results to the testbench after simulation.

17 Claims, 7 Drawing Sheets

FIG. 4

SYSTEM, METHOD, AND COMPUTER PROGRAM PRODUCT FOR TESTBENCH COVERAGE

FIELD OF THE INVENTION

The present disclosure relates to electronic designs, and more specifically, to a method for performing exhaustive coverage closure of atestbench associated with an electronic design.

DISCUSSION OF THE RELATED ART

In the world of electronic design automation ("EDA"), many different approaches have been used in order to verify the operation of an integrated circuit ("IC"). Customers run tens of thousands of simulations to verify their designs. This takes thousands of hours and generates hundreds of gigabytes of data. At the end they are still not sure if they have run enough simulations and have no way to predict how many simulations they need to run before running them. Existing approaches also fail to adequately predict the impact of adding another mode or field on the number of required simulations. Coverage must be manually analyzed to understand how much of the stimulus they need to generate has actually been generated. As random fields and constraint rules are added to their stimulus there is no way to predict the impact on the number of tests they need to run to achieve coverage.

In existing designs, testbenches are increasing in size. For example, Universal Verification Methodology ("UVM") and System Verilog ("SV") based testbenches have many classes with methods. Some of these remain un-exercised even when a full regression completes. If a particular testbench is not fully covered then it reduces the likelihood of obtaining 100% device-under-test ("DUT") coverage as well. The DUT is often a behavioral or gate level representation of a design.

SUMMARY OF DISCLOSURE

In one or more embodiments of the present disclosure, a computer-implemented electronic design process is provided. The method may include receiving an electronic design environment including both a design under test ("DUT") and a testbench. The method may further include simulating an electronic design associated with the electronic design environment and generating a coverage database associated with the electronic design. The method may include performing coverage analysis of the DUT and testbench using an automated inheritance aware analysis and applying the coverage analysis results to the testbench after simulation.

One or more of the following features may be included. In some embodiments, the testbench may be a System Verilog testbench. The testbench may include one or more hierarchical classes. The automated inheritance aware analysis may include, for each derived class, independently exercising all user functions of an associated base class. In some embodiments, a given class may be configured to inherit from a parent all coverage objects and methods associated with the parent. The method may further include identifying a base class associated with the testbench. The method may also include identifying one or more coverage items in at least one method declared in the base class.

In some embodiments, a computer-readable storage medium having stored thereon instructions that when executed by a machine result in one or more operations is provided. Operations may include receiving, using at least one processor, an electronic design environment including both a design under test ("DUT") and a testbench. Operations may further include simulating an electronic design associated with the electronic design environment and applying a coverage database to the testbench after simulation. Operations may also include performing coverage analysis of the DUT and testbench using an automated inheritance aware analysis.

One or more of the following features may be included. In some embodiments, the testbench may be a System Verilog testbench. The testbench may include one or more hierarchical classes. The automated inheritance aware analysis may include, for each derived class, independently exercising all user functions of an associated base class. In some embodiments, a given class may be configured to inherit from a parent all coverage objects and methods associated with the parent. Operations may further include identifying a base class associated with the testbench. Operations may also include identifying one or more coverage items in at least one method declared in the base class.

In one or more embodiments of the present disclosure, a system is provided. The system may include a computing device having at least one processor configured to receive, using at least one processor, an electronic design environment including both a design under test ("DUT") and a testbench. The at least one processor may be further configured to simulate an electronic design associated with the electronic design environment and applying a coverage database to the testbench after simulation. The at least one processor may be further configured to perform coverage analysis of the DUT and testbench using an automated inheritance aware analysis.

One or more of the following features may be included. In some embodiments, the testbench may be a System Verilog testbench. The testbench may include one or more hierarchical classes. The automated inheritance aware analysis may include, for each derived class, independently exercising all user functions of an associated base class. In some embodiments, a given class may be configured to inherit from a parent all coverage objects and methods associated with the parent. The at least one processor may be further configured to identify a base class associated with the testbench. The at least one processor may be further configured to identify one or more coverage items in at least one method declared in the base class.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present

FIG. 4 is a graphical user interface depicting an embodiment of testbench process consistent with the present disclosure;

DETAILED DESCRIPTION

Figure 1:
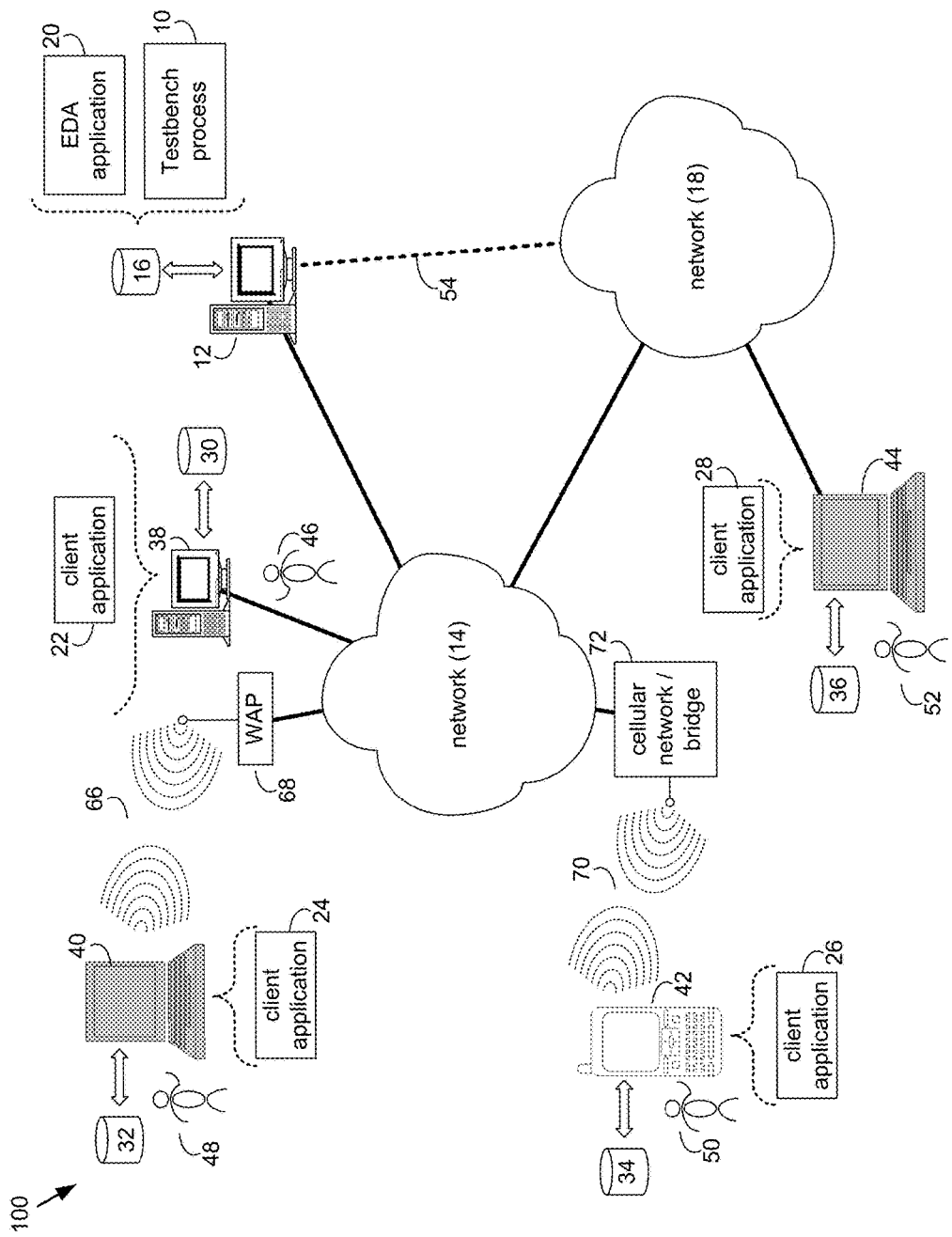
FIG. 1 is a diagram depicting an embodiment of testbench process consistent with the present disclosure.

The basic building blocks of a testbench (e.g. SV, etc.) are classes. A class may include data referred to as its properties, and methods that implement the class' behavior by operating on its properties. By way of example, SV also supports the Object Oriented Programming ("OOP") concept of inheritance, which may allow users to create a derived class by inheriting all of the properties and/or methods of a base class, and may extend its capabilities by adding new properties and/or methods. In a real life verification project, multiple verification engineers may be involved to develop the verification environment using SV classes and UVM methodology. UVM itself may include a set of base classes, which may be used to create a class based hierarchical testbench structure.

SV testbenches, for example, usually includes multiple inheritance layering of classes, with each layer owned by a specific verification engineer. Using a typical testbench code coverage solution, a user may identify holes in the testbench that need to be addressed for coverage closure. However, due to the multiple layering issue, it may be difficult to identify ownership of coverage holes for effective resolution and fast coverage closure. Further, a typical testbench coverage solution may not be exhaustive in ensuring complete coverage of each testbench layer (e.g., derived classes) and its impact on inheritance chain (e.g., base classes).

Embodiments of testbench process 10, discussed below in further detail, may include an inheritance aware type coverage of classes (e.g. SV, etc.), that may takes into account the inheritance hierarchy of SV classes to clearly identify contributions of various base/derived classes to the overall testbench coverage. Embodiments of testbench process 10 may be configured to expedite coverage hole analysis by intuitive identification of coverage holes ownership. This may allow a verification engineer to augment the relevant testbench scenarios and also ensure exhaustive coverage of the testbench itself for faster coverage closure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, the term "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

As used in any embodiment described herein, the term "testbench" may refer to a program that is part of a user's Verification environment. Its purpose is to provide stimulus to a DUT and to check the response of DUT for verifying its functionality. For example, an Ethernet protocol testbench could be injecting packets into an Ethernet router chip (DUT), and the packets with some transformation would come out of some ports of the DUT. In the Testbench, the sent packets shall be verified against received packets after required transformations are done by the DUT.

As used in any embodiment herein, the terms "simulation" and "verification" may refer to the concept of testing an electronic design and may include any actions performed by a software or hardware engine.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, System Verilog and Verilog-AMS. Various other hardware description languages may also be used as well.

Referring to FIG. 1, there is shown a testbench process 10 that may reside on and may be executed by server computer 12, which may be connected to network 14 (e.g., the Internet or a local area network, etc.). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, testbench process 10 may reside on and be executed, in whole or in part, by a client electronic device, such as a personal computer, notebook computer, personal digital assistant, or the like.

The instruction sets and subroutines of testbench process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain, for example, port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Testbench process 10 may be a stand alone application, or may be an applet/application/script that may interact with and/or be executed within EDA application 20. In addition/as an alternative to being a server-side process, testbench process 10 may be a client-side process (not shown) that may reside on a client electronic device (described below) and may interact with an EDA client application (e.g., one or more of EDA client applications 22, 24, 26, 28). Further, testbench process 10 may be a hybrid server-side/client-side process that may interact with EDA application 20 and an EDA client application (e.g., one or more of client applications 22, 24, 26, 28). As such, testbench process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize testbench process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

The term "design" as used herein may refer to, but is not limited to, an integrated circuit design, or any other suitable type of electronic design, such as those associated with electronic design automation tools. For example, an electronic design may refer to a combination of hardware (e.g. described by a hardware description language) and software to implement a range of functions. The function performed by the system may be determined by the way in which the design is configured and the data is presented to the design. Numerous designs may be simulated and any number of engines of various types may be used without departing from the scope of the present disclosure.

The term "configuration information" as used herein may refer to, but is not limited to, one or more memory elements that may be configured to control the mode of functional operation of the electronic design. Values of memory elements may be changed during operation to instruct the system to perform different operations. There may be many other elements associated with the design (e.g. even memory elements that are active as data is processed), however, the memory elements (e.g. configuration registers) described herein may be configured to control the way in which the design operates (e.g. which algorithms are run) rather than being part of an algorithm.

In some embodiments, one or more of the designs may be hardware based. Additionally and/or alternatively, one or more of the designs may be software based. For example, the operation of the first design may be a hardware operation and the operation of the second design may be a software operation. Accordingly, testbench process 10 may utilize hardware, software and any combination thereof. For example, the control of the configuration may come from either hardware or software. In some embodiments, hybrid hardware/software engines may be both be used without departing from the scope of the present disclosure.

Figure 2:
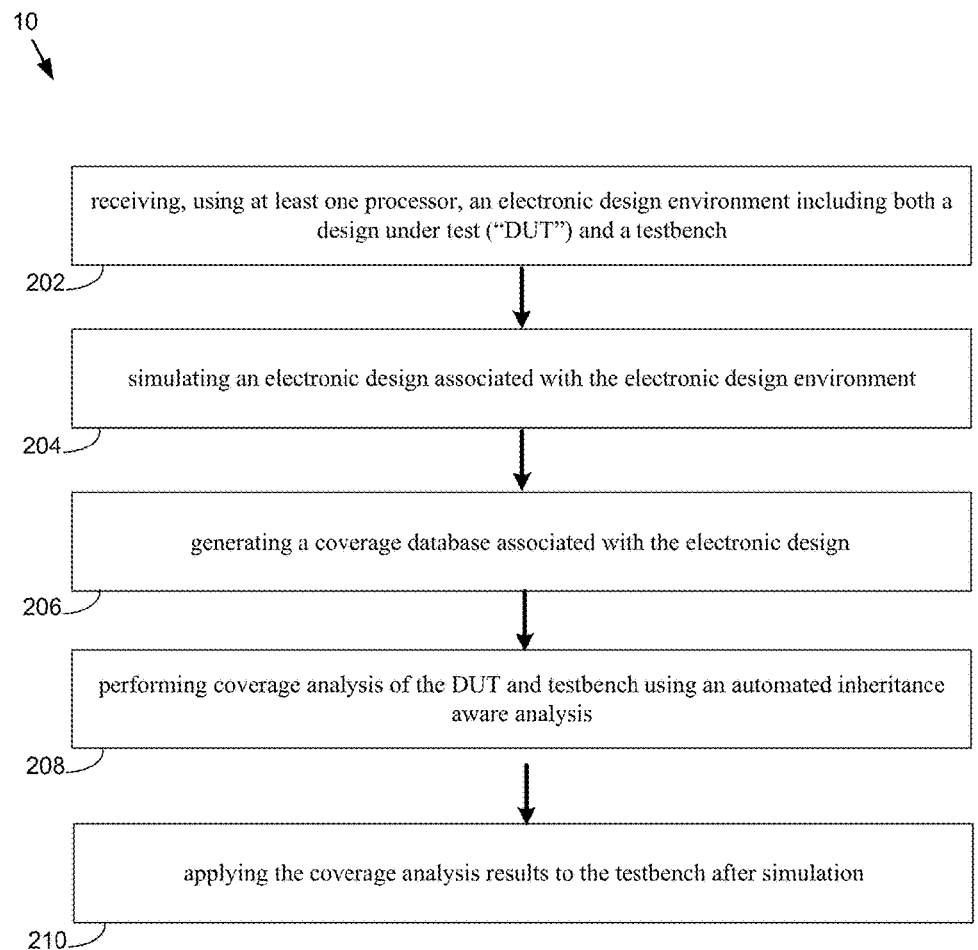
FIG. 2 is a flowchart depicting example operations with an embodiment of testbench process consistent with the present disclosure.

Referring also to FIG. 2, a flowchart depicting an embodiment consistent with testbench process 10 is provided. Embodiments may include receiving (202) an electronic design environment including both a design under test ("DUT") and a testbench. Embodiments may further include simulating (204) an electronic design associated with the electronic design environment and generating (206) a coverage database associated with the electronic design. The method may include performing (208) coverage analysis of the DUT and testbench using an automated inheritance aware analysis and applying (210) the coverage analysis results to the testbench after simulation. These and numerous additional operations are also within the scope of the present disclosure, which are discussed in further detail hereinbelow.

As discussed above, testbenches are growing, particularly UVM/SV based testbenches, which may include many classes with methods. Some of these may remain un-exercised even when a full regression completes. If a testbench is not fully covered then it is less likely to have 100% DUT coverage as well. Accordingly, embodiments of testbench process 10 may be configured to estimate what portions of testbench code (e.g. the one inside classes) may be covered. In some embodiments, a different metric may be introduced namely "class-based block coverage" that may track code coverage within methods of SV testbench classes. An additional sign off metric may be used for chip tapeout.

Embodiments of testbench process 10 may provide a number of advantages over existing approaches. Some of these may include, but are not limited to, identifying unexercised portions of testbenches (e.g. UVM, etc.) indicative of an absence of stimulus. This may be useful prior to the analysis of DUT coverage as the stimulus itself may be missing. Other advantages may include knowledge about knobs or sequences that are not exercised, knowledge about instantiated classes vs un-instantiated classes for a given test, better UVM analysis in-sight from the testbench viewpoint, etc. It should also be noted that this coverage could be run before DUT is created and could provide insight into testbench comprehensiveness.

Figure 3:
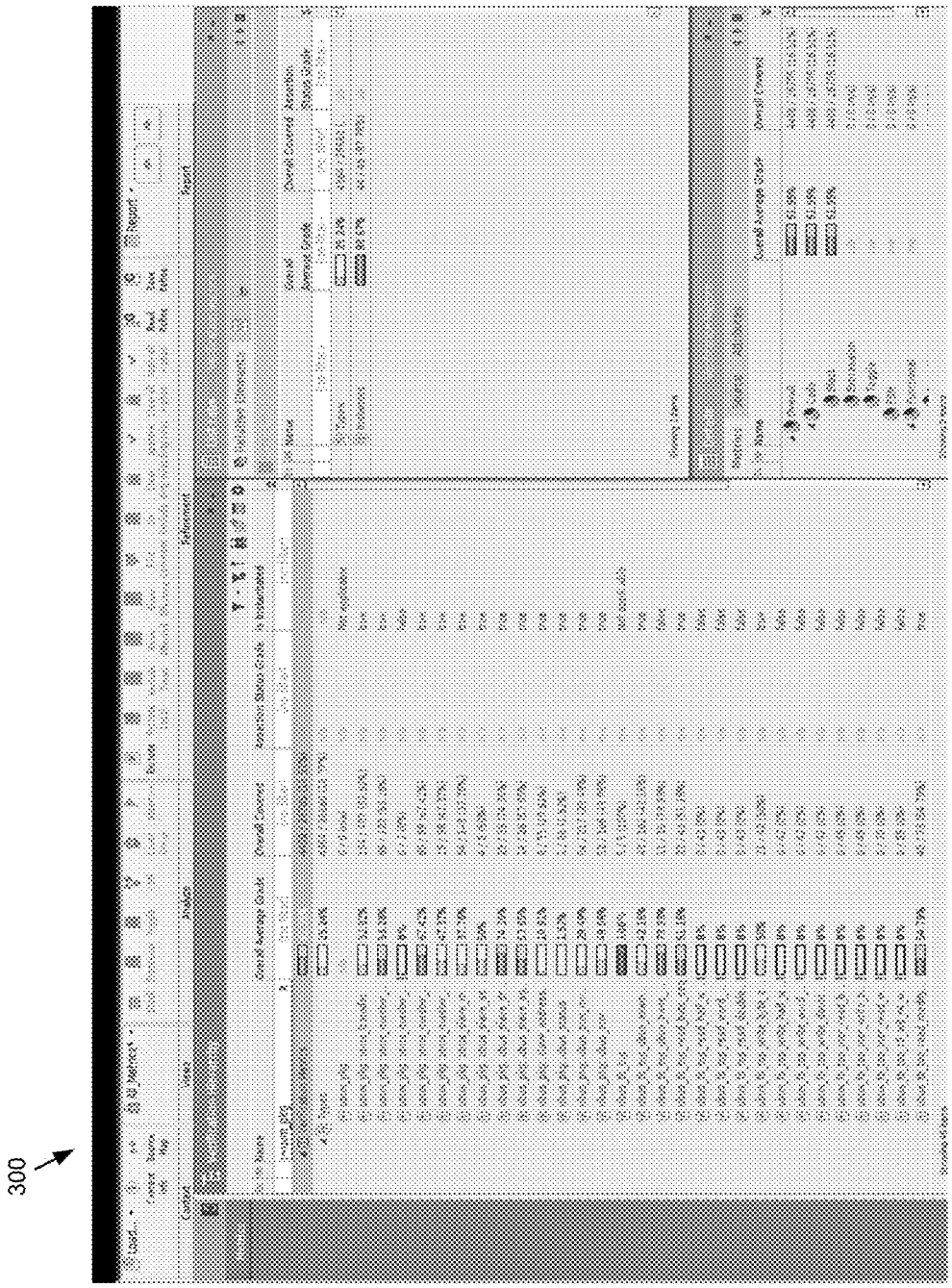
FIG. 3 is a graphical user interface depicting an embodiment of testbench process consistent with the present disclosure.
Figure 4:
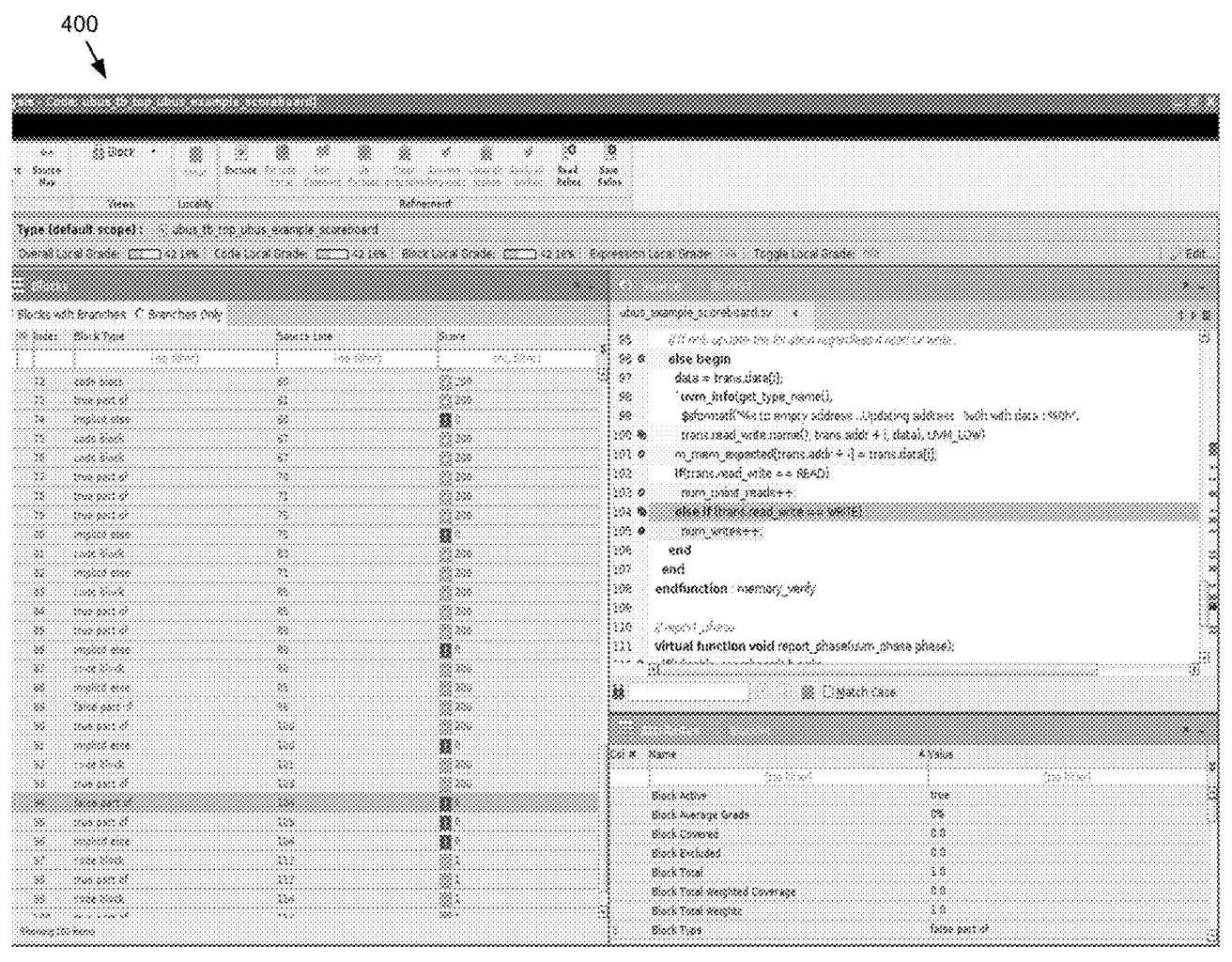

In some embodiments, and referring also to FIGS. 3-4, the scope of code coverage associated with testbench process 10 may include covering all classes declared in one or more of the compilation unit, module, program blocks, interfaces, etc. All classes inside imported packages may be covered. In some embodiments, block coverage in methods (e.g., functions and tasks) of classes may be employed. Used as well as unused methods may be covered. Accordingly, users may analyze if the methods should have been covered but are not. FIG. 3 depicts a plurality of reports of coverage of a testbench class. FIG. 4 includes a window that shows coverage inside class methods.

In some embodiments, coverage Items inside all the methods may include, but are not limited to, static, virtual, local, protected, etc. Additionally and/or alternatively, some or all classes that may or may not have been instantiated may be represented in coverage view with a coverage analysis tool such as IMC/vManager. Each specialization of a parameterized class may be reported separately.

In some embodiments, testbench process 10 may initiate SV testbench coverage using any suitable technique. For example, using a Coverage Configuration input to select all the classes. Options may also be available to selectively enable coverage inside certain classes. For example, a user may decide to de-select UVM package, deselect UVM macros, etc. This may help to reduce unwanted coverage due to standardized macros and standardized library functions.

In some embodiments, testbench process 10 may be used to more adequately determine whether or not verification is complete. As discussed herein, a derived class may inherit all of the members of a base class, however it may not be known to a verification manager whether the derived class has exercised all of the functions of a base class from each of derived class object. For example, consider a base class "Base" with two functions "compute_area( )" and "compute_perimeter( )". Derived class A has one additional function "set_color( )". Derived class B has one additional function "compute_volume( )". Therefore, object of A could invoke compute_area( ) compute_perimeter( ) and set_color( ). Similarly, an instance object of B could invoke compute_area( ), compute_perimeter( ) and compute_volume( ).

In some embodiments, testbench process 10 may be used by a verification team of two engineers to obtain 100% SV testbench block Coverage. For example, if the first engineer created object of Class A and invoked the functions compute_area( ), compute_perimeter( ) and set_color( ). Then, the second engineer could create an object of class B and invoke only compute_volume( ). The total block coverage for the testbench is now 100%.

However, it may be important that for object B one must additionally exercise both the base functions independently. This problem may be solved by testbench process 10, which may employ an inheritance aware SV testbench solution. Each and every derived class Driver/Monitor has to independently exercise all user functions of the Base class (e.g., to be more rigorous in scenarios) and only then one could be 100% covered for his or her aspect of scenario verification. This approach allows one to monitor each verification engineer's scope of coverage independently and not aggregating coverage for tests of base classes completed by unrelated independent test cases. More pessimistic behavior generates better scenario coverage.

For example, a Phy layer may have a common encoding scheme function such as 8B/10B in a base class and word compositions. However, it may still need independent testing for PCI and Ethernet protocols and may need to measure whether the Ethernet team has also exercised base functions completely. Coverage of Phy layer functions by just one protocol (e.g., PCI) are not enough. Since msb and lsb alignments could be different for Ethernet and PCI, special control K characters could have been used that may have a meaning for one protocol and not for another.

As discussed above, embodiments of testbench process 10 may incorporate inheritance aware functionality. For example, in SV a testbench derived class may inherit the methods of its base class. This feature provides information as to whether functions of a base class are getting called by objects of all its derived classes and how well the derived classes cover those functions.

It should be noted that prior to the teachings of the present disclosure, ASIC and chip signoff was primarily done using DUT coverage. Some of the DUT coverage objects are also represented in the testbench (e.g., assertions and cover groups). Embodiments of testbench process 10 may be directed at covering the code within the testbench itself. Accordingly, testbench process 10 may be used as a new metric for signoff for the chip. Additionally and/or alternatively, testbench code coverage may be used as a new sign off metric. In this way, all forms of coverage objects with associated metrics (e.g., line, block, expression, toggle, etc) that are allowed with DUT may also be feasible for coverage of the testbench itself. More specifically, embodiments of testbench process 10 may be configured to cover the code within functions and methods of classes within the testbench using block and expression coverage. Accordingly, the flow may be directed at reporting code coverage of classes and from the coverage gathered, as such, a user may be able to derive inferences for missing scenarios for which new test cases could be added. For example, the testbench may be modified, a user may remove redundancies, and refinements and/or exclusions could be performed on the testbench code. Additionally and/or alternatively, this flow may be augmented to allow for more comprehensive or exhaustive testbench coverage such as the inheritance aware testbench coverage described herein.

In operation, for inheritance aware mode the coverage may be instrumented and collected, thus being fully aware of the inheritance class hierarchy. A given class inherits from its parent all coverage objects and methods and its parent's parent and so on in OOPS manner. In some embodiments, a class at a leaf level of hierarchy reports its contribution for all its base classes from which it derives. The entire hierarchy of inheritance may be scored and reported for coverage. Coverage would be considered complete when each inheritance hierarchy chain is covered completely to 100% and independently of any other inheritance hierarchy chain. As such, testbench process 10 may provide "exhaustive" coverage and is far more accurate than simple coverage where each class object reports only self coverage.

In some embodiments, testbench process 10 may be configured to determine how well the leaf level class objects have exercised the base classes and where they have not exercised. This leads to an inference or determination of holes or missing scenario identification with which testbenches could be modified or refined. The identification of missing scenarios and holes in a testbench provide enormous gains to silicon vendors to improve the quality of verification and productivity as well as faster coverage closure and a reduced probability of getting bugs to silicon.

Figure 5:
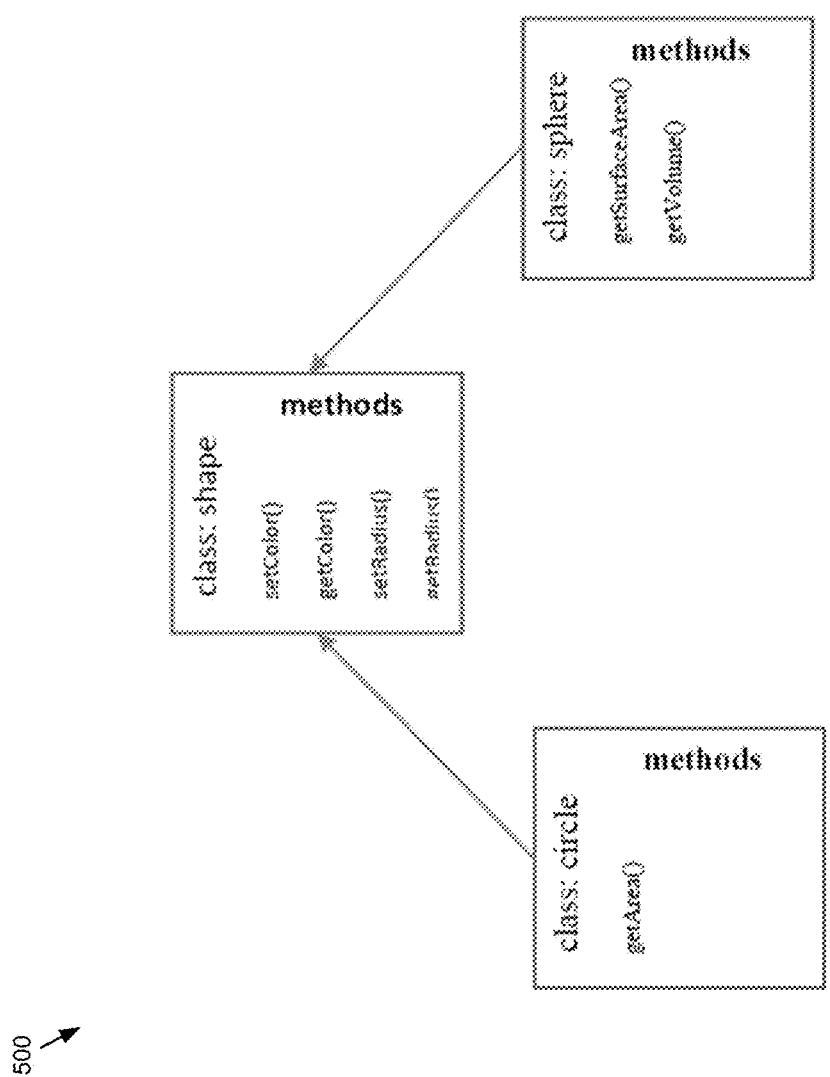
FIG. 5 is a diagram depicting an example of inheritance associated with an embodiment of testbench process consistent with the present disclosure.
Figure 6:
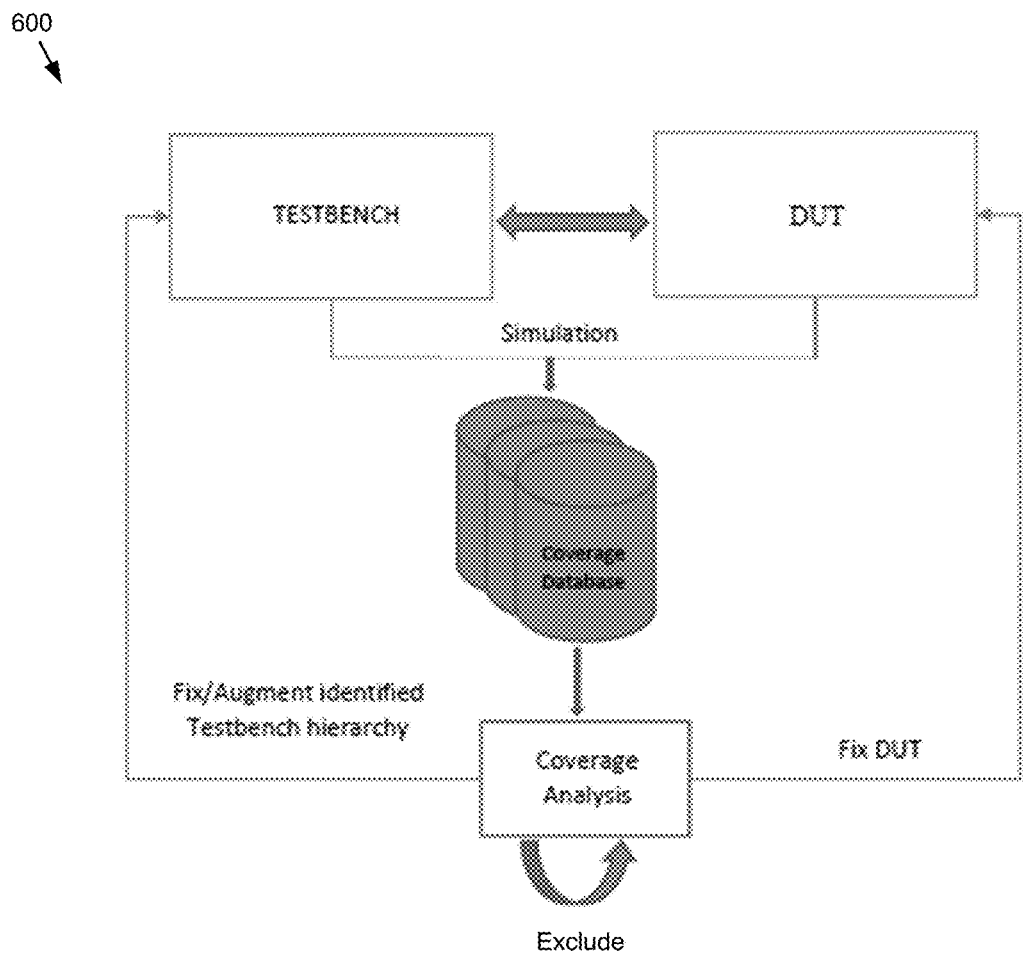
FIG. 6 is a diagram depicting an embodiment of testbench process consistent with the present disclosure.
Figure 7:
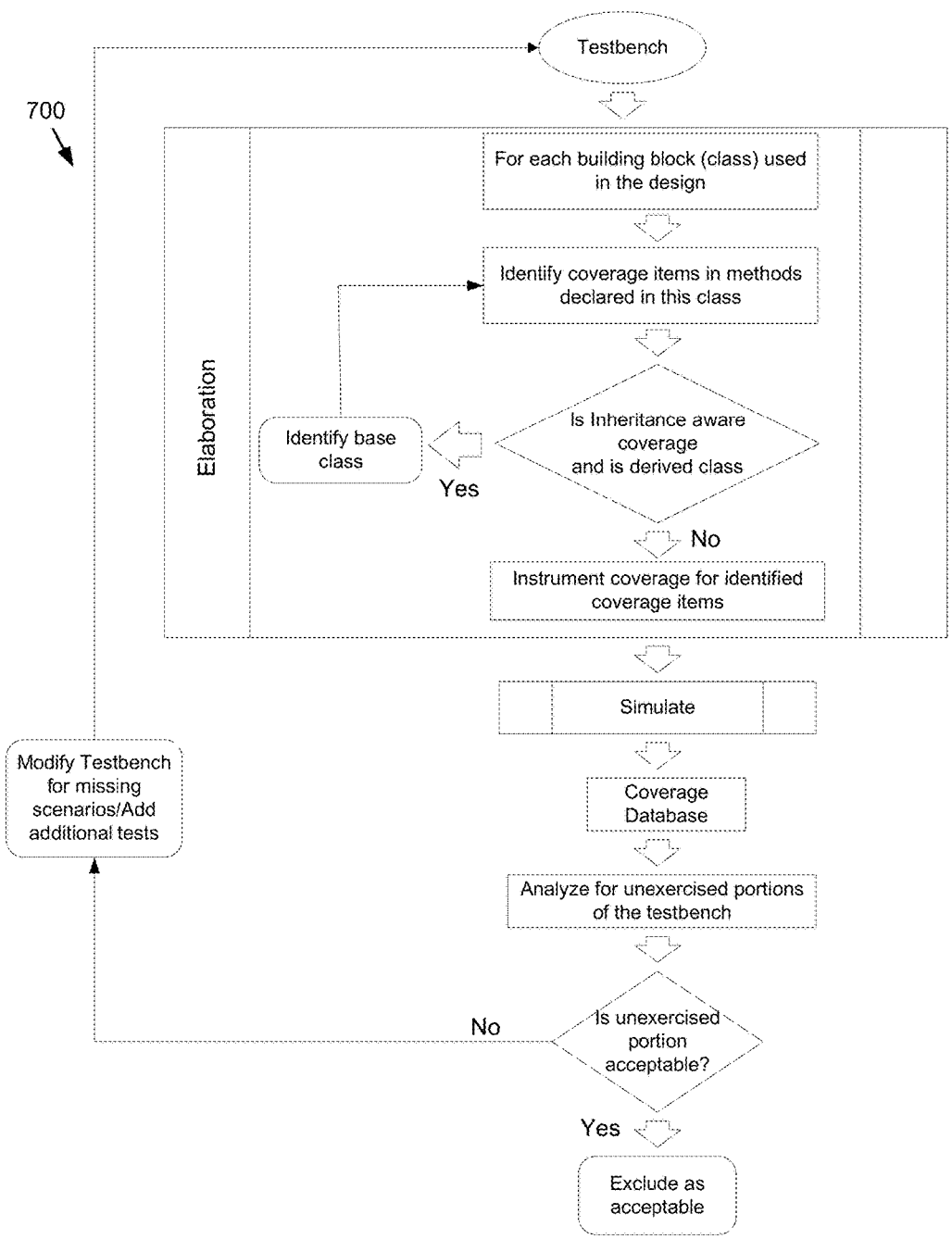
FIG. 7 is a diagram depicting an embodiment of testbench process consistent with the present disclosure.

Referring now to FIGS. 5-7, embodiments consistent with testbench process 10 are provided. For example, the flowchart in FIG. 6 depicts two sources (e.g. DUT simulation coverage and inheritance aware testbench coverage) associated with the coverage database. The splitting of the coverage closure analysis guides the appropriate direction to focus upon. Coverage analysis of the testbench may reveal holes in the implementation of the methods of classes involved in constructing the testbench class hierarchy. The metric we have chosen to demonstrate is block coverage as it simplistically and directly shows which class method flows are not realized during the testbench execution. A block includes all the sequential statements that will always be executed in a single flow. Flow breaks due to error, exit, delay, branch, or some other construct, marks the onset of a new block.

In some embodiments, the blocks inside a class may belong to itself and may also be inherited by its derived class(es) if any. For example, in the class hierarchy of FIG. 5, the classes "circle" and "sphere" are extending common base class "shape" and thereby inheriting the methods—setColor( ), getColor( ), setRadius( ), getRadius( ). The coverage closure using testbench process 10 guarantees that encapsulated data in individual derived classes (here "circle" and "sphere") is verified. That is, each of the derived classes separately executes the coverage items inside the inherited methods. The verification of "circle" is to be considered closed when the testbench has executed getArea( ) along with the inherited methods. Similarly, the verification of "sphere" is to be considered closed when the testbench has executed getSurfaceArea( ) and getVolume( ) along with the inherited methods. Non-coverage of inherited methods may be due to un-instantiated derived class, un-executed inherited methods that otherwise need to be executed through direct calls of the derived class objects, and/or un-executed inherited methods that otherwise may be executed through calls from inside the derived class methods.

Referring also to FIG. 7, an example of a flowchart 700 depicting operations that may be used in accordance with testbench process 10 is provided. Some of the operations provided in FIG. 7 may be omitted, if desired. Moreover, any suitable HDL or software language may be used without departing from the scope of the present disclosure. Any reference to a specific language as contained herein is made merely by way of example.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. An electronic design process comprising:
   receiving, using at least one processor, an electronic design environment including both a design under test ("DUT") to be fabricated and a System Verilog testbench;
   simulating an electronic design associated with the electronic design environment;
   generating a coverage database associated with the electronic design;
   identifying one or more unexercised portions of the System Verilog testbench indicative of an absence of a stimulus;
   performing coverage analysis of the DUT and the System Verilog testbench using an automated System Verilog inheritance aware analysis, wherein the automated System Verilog inheritance aware analysis includes applying an object oriented programming inheritance hierarchy to the coverage analysis of the testbench;
   generating coverage analysis results; and
   applying the coverage analysis results to the testbench after simulation; wherein the electronic design is provided to a fabrication facility to manufacture integrated circuits.

2. The electronic design process of claim 1, wherein the testbench includes one or more hierarchical classes.

3. The electronic design process of claim 1, wherein the automated inheritance aware analysis includes, for each derived class, independently exercising all user functions of an associated base class.

4. The electronic design process of claim 1, wherein a given class is configured to inherit from a parent all coverage objects and methods associated with the parent.

5. The electronic design process of claim 1, further comprising:
   identifying a base class associated with the testbench.

6. The electronic design process of claim 5, further comprising:
   identifying one or more coverage items in at least one method declared in the base class.

7. A non-transitory computer-readable storage medium having stored thereon instructions that when executed by a processor perform one or more operations, the operations comprising:
   simulating an electronic design associated with an electronic design environment;
   generating a coverage database associated with the electronic design;
   identifying one or more unexercised portions of a System Verilog testbench indicative of an absence of a stimulus;
   performing coverage analysis of a design under test ("DUT") to be fabricated and the System Verilog testbench using an automated System Verilog inheritance aware analysis, wherein the automated System Verilog inheritance aware analysis includes applying an object oriented programming inheritance hierarchy to the coverage analysis of the testbench;
   generating coverage analysis results; and
   applying the coverage analysis results to the testbench after simulation; wherein the electronic design is provided to a fabrication facility to manufacture integrated circuits.

8. The non-transitory computer-readable storage medium of claim 7, wherein the testbench includes one or more hierarchical classes.

9. The non-transitory computer-readable storage medium of claim 7, wherein the automated inheritance aware analysis includes, for each derived class, independently exercising all user functions of an associated base class.

10. The non-transitory computer-readable storage medium of claim 7, wherein a given class is configured to inherit from a parent all coverage objects and methods associated with the parent.

11. The non-transitory computer-readable storage medium of claim 7, further comprising:
    identifying a base class associated with the testbench.

12. The non-transitory computer-readable storage medium of claim 11, further comprising:
    identifying one or more coverage items in at least one method declared in the base class.

13. An electronic design system comprising:
    at least one processor configured to receive an electronic design environment including both a design under test ("DUT") to be fabricated and a System Verilog testbench, the at least one processor further configured to simulate an electronic design associated with the electronic design environment, the at least one processor configured to generate a coverage database associated with the electronic design and identify one or more unexercised portions of the System Verilog testbench indicative of an absence of a stimulus, the at least one processor further configured to perform coverage analysis of the DUT and the System Verilog testbench using an automated System Verilog inheritance aware analysis, wherein the automated System Verilog inheritance aware analysis includes applying an object oriented programming inheritance hierarchy to the coverage analysis of the testbench, the at least one processor further configured to generate coverage analysis results, the at least one processor configured to apply the coverage analysis results to the testbench after simulation; wherein the electronic design is provided to a fabrication facility to manufacture integrated circuits.

14. The electronic design system of claim 13, wherein the testbench includes one or more hierarchical classes.

15. The electronic design system of claim 13, wherein the automated inheritance aware analysis includes, for each derived class, independently exercising all user functions of an associated base class.

16. The electronic design system of claim 13, wherein a given class is configured to inherit from a parent all coverage objects and methods associated with the parent.

17. The electronic design system of claim 16, further comprising:
    identifying a base class associated with the testbench; and
    identifying one or more coverage items in at least one method declared in the base class.

* * * * *